(12) United States Patent
Kim et al.

(10) Patent No.: US 11,508,908 B2
(45) Date of Patent: Nov. 22, 2022

(54) SUBSTRATE ETCHING METHOD FOR MANUFACTURING MASK

(71) Applicant: Samsung Display Co., Ltd., Yongin-Si (KR)

(72) Inventors: Jeongkuk Kim, Suwon-si (KR); Kyuhwan Hwang, Seongnam-si (KR)

(73) Assignee: Samsung Display Co., Ltd.

( * ) Notice: Subject to any disclaimer, the term of this patent is extended or adjusted under 35 U.S.C. 154(b) by 83 days.

(21) Appl. No.: 16/663,287

(22) Filed: Oct. 24, 2019

(65) Prior Publication Data

US 2020/0152880 A1    May 14, 2020

(30) Foreign Application Priority Data

Nov. 13, 2018  (KR) .................. 10-2018-0139333

(51) Int. Cl.
 H01L 51/00    (2006.01)
 H01L 51/56    (2006.01)

(52) U.S. Cl.
 CPC ...... *H01L 51/0027* (2013.01); *H01L 51/0002* (2013.01); *H01L 51/56* (2013.01)

(58) Field of Classification Search
 CPC .. H01L 51/0027; H01L 51/0002; H01L 51/56
 See application file for complete search history.

(56) References Cited

U.S. PATENT DOCUMENTS

| | | | | |
|---|---|---|---|---|
| 4,689,114 A | * | 8/1987 | Ohtake | C23F 1/04 216/12 |
| 5,221,422 A | * | 6/1993 | Das | G03F 7/70875 216/57 |
| 5,340,628 A | * | 8/1994 | McKillip | B41M 5/24 428/203 |
| 10,151,041 B2 | | 12/2018 | Han | |
| 10,208,373 B2 | | 2/2019 | Mizumura | |
| 2007/0148588 A1 | * | 6/2007 | Park | G03F 7/40 430/270.1 |
| 2010/0155380 A1 | * | 6/2010 | Blackall | G06K 1/12 219/121.69 |
| 2010/0156007 A1 | * | 6/2010 | Huang | B29C 37/0032 264/478 |
| 2012/0052288 A1 | * | 3/2012 | Tung | C23C 14/0015 428/328 |
| 2012/0258428 A1 | * | 10/2012 | Molz | A47B 57/10 433/174 |

(Continued)

FOREIGN PATENT DOCUMENTS

| | | |
|---|---|---|
| JP | 3061790 B1 | 7/2000 |
| JP | 5958824 B2 | 8/2016 |

(Continued)

*Primary Examiner* — Katherine A Bareford
*Assistant Examiner* — Christina D McClure
(74) *Attorney, Agent, or Firm* — Innovation Counsel LLP (57) ABSTRACT

A method for manufacturing a mask may include the following steps: preparing a substrate; providing a first coating, which may be optically transparent, may cover a covered portion of the substrate, and may expose exposed portions of the substrate; forming a scattering layer between the first coating layer and the covered portion of the substrate; and removing the exposed portions of the substrate to form mask holes.

20 Claims, 8 Drawing Sheets

(56) References Cited

U.S. PATENT DOCUMENTS

| | | | | |
|---|---|---|---|---|
| 2013/0078423 A1* | 3/2013 | Sutou | ............... | B23K 26/354 |
| | | | | 428/141 |
| 2013/0314685 A1* | 11/2013 | Shin | ............... | G03F 7/70733 |
| | | | | 355/72 |
| 2014/0377903 A1* | 12/2014 | Takeda | ............... | H01L 51/56 |
| | | | | 438/99 |
| 2017/0045781 A1* | 2/2017 | Bai | ............... | G02F 1/133707 |
| 2018/0337334 A1 | 11/2018 | Kim et al. | | |

FOREIGN PATENT DOCUMENTS

| | | | | |
|---|---|---|---|---|
| KR | 10-1227137 B1 | 1/2013 | | |
| KR | 10-1582175 B1 | 1/2016 | | |
| KR | 10-2016-0117798 A | 10/2016 | | |
| KR | 10-2018-0001666 A | 1/2018 | | |
| KR | 10-2018-0128115 A | 12/2018 | | |
| WO | WO-2016199100 A1 * | 12/2016 | ....... | B29C 45/14311 |

* cited by examiner

SUBSTRATE ETCHING METHOD FOR MANUFACTURING MASK

CROSS-REFERENCE TO RELATED APPLICATION(S)

This U.S. non-provisional patent application claims priority under 35 U.S.C. § 119 to Korean Patent Application No. 10-2018-0139333, filed on Nov. 13, 2018, in the Korean Intellectual Property Office; the entire contents of the Korean Patent Application are incorporated by reference.

BACKGROUND

The technical field relates to a method of etching a substrate for manufacturing a mask.

In general, an organic light emitting diode (OLED) display device includes an organic light emitting element for emitting light through an electrical excitation process. The organic light emitting element typically has a multi-layered structure including an emitting layer (EML), an electron transport layer (ETL), and a hole transport layer (HTL). In certain cases, the organic light emitting element may further include an electron Injection layer (EIL) and a hole injection layer (HIL).

The organic light emitting element is typically fabricated through a deposition process. A fine metal mask (FMM) is used in the deposition process. The fine metal mask includes a mask patterns formed by a chemical etching process, a plating-based patterning process, and/or a laser etching process.

SUMMARY

An embodiment may be related a method of producing a mask for optimizing a yield of organic light emitting element manufacturing and/or display device manufacturing.

According to an embodiment, a method of etching a substrate may include preparing a target substrate, the target substrate including a plurality of hole regions and a blocking region enclosing the hole regions, when viewed in a plan view, forming a first coating layer, which has an optically transparent property, on the target substrate, forming a scattering layer between the first coating layer, which is overlapped with the blocking region in a plan view, and the target substrate, and etching the hole, regions of the target substrate to form a plurality of mask holes.

In an embodiment, the method may further include patterning the first coating layer, after the foraging of the first coating layer. The patterned first coating layer may be overlapped with the blocking region and may be not overlapped with the hole regions in a plan view.

In an embodiment, the forming of the scattering layer may include producing particles on the target substrate by irradiating the target substrate with a first laser and then removing the particles from the hole regions. The particles on the blocking regions may be covered with the first coating layer.

In an embodiment, the producing of the particles on the target substrate may be performed to irradiate the first laser onto an entire region of the hole and blocking regions.

In an embodiment, the producing of the particles on the target substrate may he performed in such a way that a focal point of the first laser is located between the first coating layer and the target substrate.

In an embodiment, the first laser may have a diameter of about 2 μm or smatter.

In an embodiment, the first coating layer may have a thickness of about 1.5 μm or thicker.

In an embodiment, the forming of the mask holes may include irradiating the target substrate with a second laser.

In an embodiment, the second laser may have a diameter larger than the diameter of the first laser.

In an embodiment, the diameter of the second laser may be larger than or equal to about 10 μm.

In an embodiment, the first laser may have a focal length that is shorter than a focal length of the second laser.

In an embodiment, the first laser and the second laser may have a same wavelength band.

In an embodiment, the method may further include removing the first coating layer and the scattering layer, after the forming of the mask holes in the target substrate.

In an embodiment, the first coating layer may include a negative photoresist.

In an embodiment, the first coating layer may be provided in a form of a tape and may be disposed on the target substrate.

In an embodiment, the target substrate may include a metallic material.

In an embodiment, the method may further include forming a second coating layer on the scattering layer and the target substrate, after the forming of the scattering layer. The second coating layer may have an optically transparency lower than the first coating layer.

In an embodiment, the method may further include removing the first coating layer, the scattering layer, and the second coating layer, after the forming of the mask holes.

In an embodiment, the second coating layer may include positive photoresist.

According to an embodiment, a method of etching a substrate may include preparing a target substrate, the target substrate including a plurality of hole regions and a blocking region enclosing the hole regions, when viewed in a plan view, forming a first coating layer on the target substrate, the first coating layer having an optically transparent property and being overlapped with the blocking region, but not with the hole regions in a plan view, irradiating a first laser to form a scattering layer between the first coating layer, which is overlapped with the blocking region in a plan view, and the target substrate, and irradiating a second laser to etch the hole regions of the target substrate, the second laser having a diameter larger than a diameter of the first laser.

An embodiment may be related to a method manufacturing a mask may include the following steps: preparing a substrate; providing a first coating, which may be optically may cover a covered portion of the substrate, and may expose exposed portions of the substrate: forming a scattering layer between the first coating layer and the covered portion of the substrate; and removing the exposed portions of the substrate to form mask holes.

The method may include the following steps: preparing a material layer; and patterning the material layer to form the first coating.

The forming of the scattering layer may include producing particles on the substrate by irradiating the substrate with a first laser. A material of the particles may be identical to a material of the substrate. The particles may include a first particle set and a second particle set. The first particle set may be positioned on the covered portion of the substrate. The second particle set may be positioned on the exposed portions of the substrate. The for of the scattering layer may include removing the second particle set. The first particle set may be covered by the first coating. The scattering layer may include the first particle set.

The producing of the particles on the substrate may include irradiating the first laser onto both the covered portion of the substrate and the exposed portions of the substrate.

The producing of the particles on the substrate may include positioning a focal point of the first laser between the first coating and the substrate.

The first laser may have a diameter of 2 µm or smaller.

The first coating may have a thickness of 1.5 µm or thicker.

The removing of the exposed portions of the substrate may include irradiating the substrate with a second laser.

A maximum diameter of the second laser may be larger than a maximum diameter of the first laser.

The maximum diameter of the second laser may be larger than or equal to 10 µm.

A focal length of the first laser may be shorter than a focal length of the second laser.

The first laser and the second laser have a same wavelength band.

The method may include removing the first coating and the scattering removing of the exposed portions of the substrate.

The first coating may include a negative photoresist.

The first coating may include openings before the first coating is disposed on the substrate. The openings may expose the exposed portions of the substrate.

The substrate may include a metallic material.

The method may include forming a second coating on the scattering layer and the substrate after the forming of the scattering layer. An optical transparency of the second coating may be lower than an optical transparency of the first coating.

The method may include removing the first coating, the scattering layer, and the second coating after the removing of the exposed portions of the substrate.

The second coating may include a positive photoresist.

An embodiment may be related to a method for manufacturing a mask. The method may include the following steps: preparing a substrate; providing a first coating on the substrate, first coating being optically transparent, covering a covered portion of the substrate, and exposing exposed portions of the substrate; irradiating a first laser on the substrate to form a scattering layer between the first coating and the substrate; and irradiating a second laser to etch the exposed portions of the substrate. A maximum diameter of the second laser may be larger than a maximum diameter of the first laser.

These figures are intended to illustrate general characteristics of methods, structure, and/or materials utilized in certain example embodiments and to supplement the written description provided below. These drawings should not be interpreted as limiting the example embodiments. In the figures, relative thicknesses and positions may be reduced or exaggerated for clarity. Similar or identical reference numbers may indicate similar or identical elements or features.

DETAILED DESCRIPTION

Example embodiments are described with reference to the accompanying drawings. Practical embodiments may be embodied in many different forms and should not be construed as being limited to the embodiments set forth herein. In the drawings, thicknesses of layers and regions may be exaggerated for clarity. Like reference numerals may denote like elements.

Although the terms "first," "second," etc. may be used to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first,"second, etc. may be used to differentiate different categories or sets of elements. For conciseness, the terms "first," "second," etc. may represent "first-type (or first-set)," "second-type (or second-set)," etc., respectively.

When a first element is referred to as being "on," "connected," or "coupled" to a second element, the first element can be directly on, directly or directly coupled to the second element, or one or more intervening elements may be present between the first element and the second element. When a first element is referred to as being "directly on," "directly connected," or "directly coupled" to a second element, there are no intervening elements (except environmental elements such as air) present between the first element and the second element.

The term "and/or" may indicate any and all combinations of one or more of the associated items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting. The singular forms "a," "an," and "the" may include the plural forms as well, unless the context clearly indicates otherwise. The terms "comprises," "comprising," "includes," and/or "including" may specify the presence of stated features, integers, steps, operations, elements and/or components, but do not preclude the presence or addition of one or more other features, integers, steps, operations, elements, and/or components.

Example embodiments are described herein with reference to cross-sectional illustrations that are schematic illustrations of idealized structures. Variations from the shapes of the illustrations as a result, for example, of manufacturing techniques and/or tolerances are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art. Terms, such as those defined in commonly-used dictionaries, should be interpreted as having a meaning that is consistent with their meaning in the context of the relevant art and will not be interpreted in an idealized or overly formal sense unless expressly defined herein.

Figure 1:
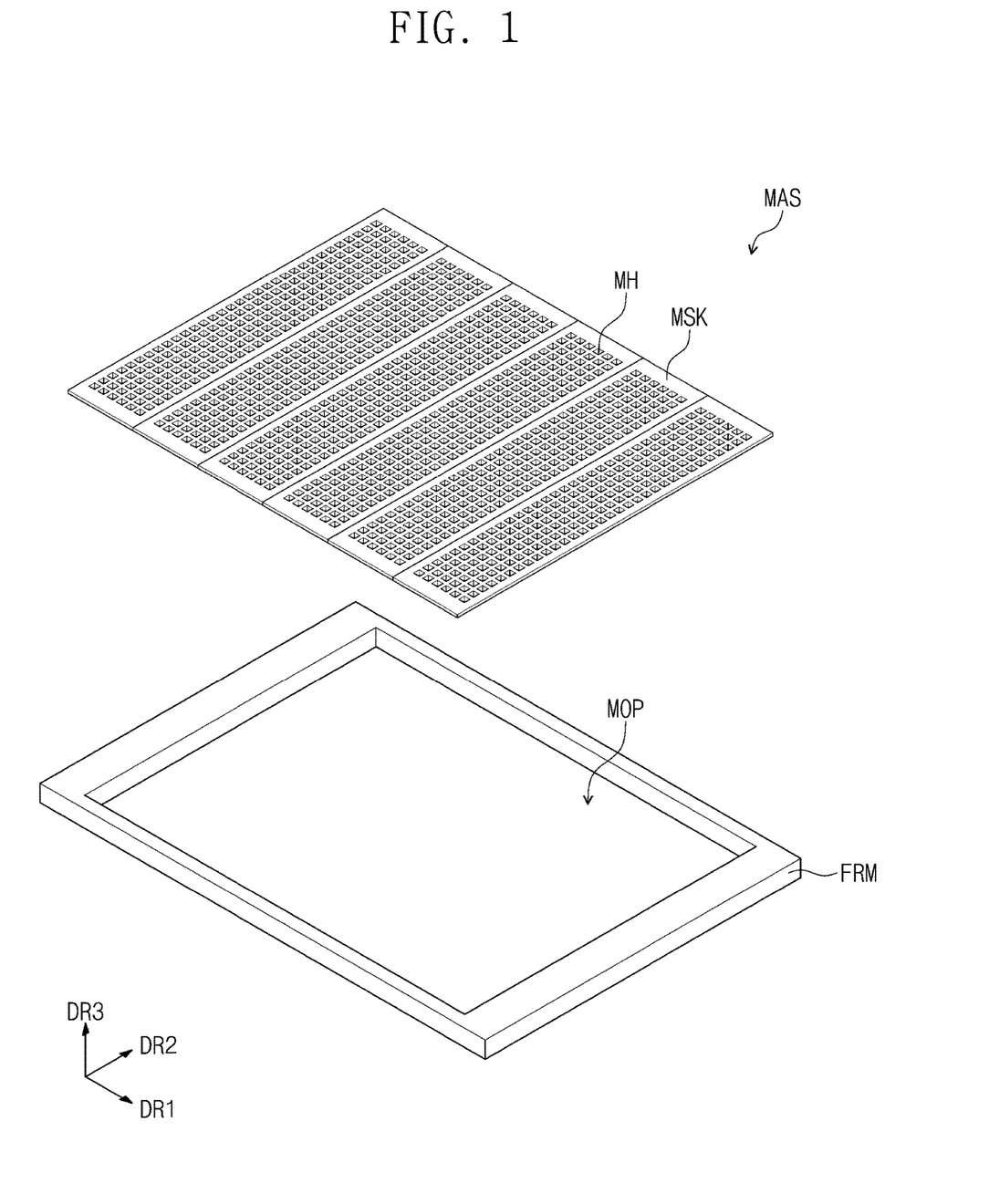
FIG. 1 is an exploded perspective view illustrating a mask assembly structure according to an embodiment.

FIG. 1 is an exploded perspective view illustrating a mask assembly structure MAS according to an embodiment.

The mask assembly structure MAS may be used in a process of depositing a deposition material on a process target object. In an embodiment, the mask assembly structure MAS may be used in an organic material deposition process for fabricating an organic light emitting element (not shown), and the process target object may be a base substrate of an organic light emitting display panel.

The mask assembly structure MAS may include a support frame FRM and a plurality of deposition masks MSK.

The support frame FRM may have a ring or loop shape, when viewed in a plan view in a third direction DR3. In an embodiment, the support frame FRM may have a rectangular structure, whose long side is parallel to the first direction DR1 and whose short side is parallel to the second direction DR2 and/or perpendicular to the first direction DR1.

In a plan view, an opening MOP may be in a center region of the support frame FRM. The opening MOP may have a rectangular shape whose long side is parallel to the first direction DR1 and whose short side is parallel to the second direction DR2. Lengths of the opening MOP in the first and second directions DR1 and DR2 may be determined depending on the number or sizes of the masks MSK.

The masks MSK may be mounted on the support frame FRM. The masks MSK may be arranged in the first direction DR1. Each of the masks MSK may extend in the second direction DR2. An array of the masks MSK may be exposed through the opening MOP of the support frame FRM.

Opposite ends of each of the masks MSK in the second direction DR2 may overlap the support frame FRM and may be mounted on the support frame FRM. The opposite ends of the masks MSK may be combined to the support frame FRM by a bonding process (e.g., a welding process).

A plurality of mask holes MH may be defined in each of the masks MSK. The mask holes MH may be arranged in a matrix/array in each of the masks MSK. The mask holes MH may be exposed through the opening MOP of the support frame FRM. Thus, during a deposition process, a deposition material (not shown) may pass through the opening MOP and the mask holes MH.

The mask holes may define deposition regions on a process target object (not shown). Sizes, shapes, and the number of patterns deposited on the process target object in a deposition process may depend on sizes, shapes, and the number of the mask holes MH.

Figure 2:
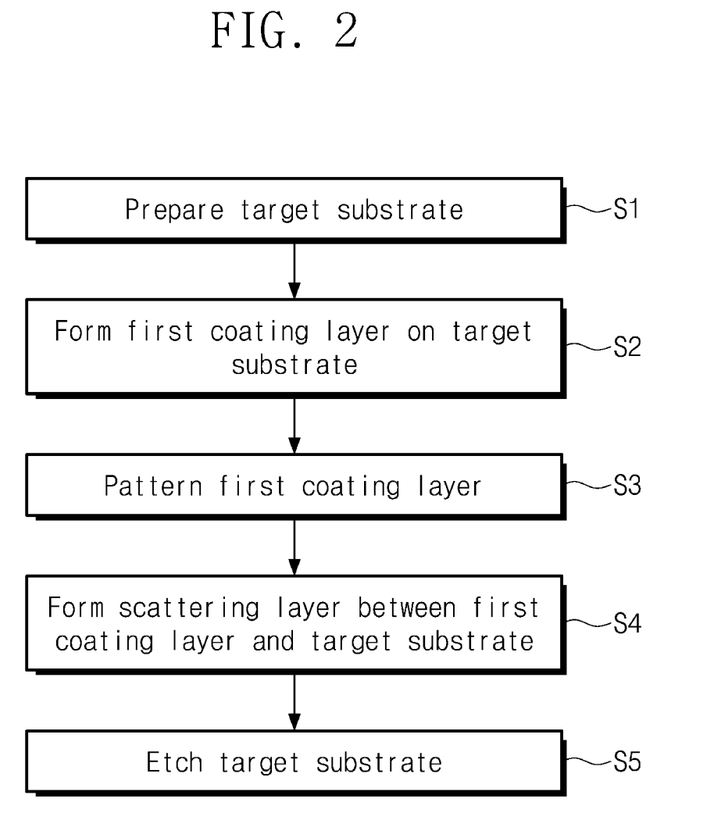
FIG. 2 is a flow chart illustrating a method of etching a substrate according to an embodiment.

FIG. 2 is a flow chart illustrating steps in a method of etching a substrate for forming a mask according to an embodiment.

Figure 3:
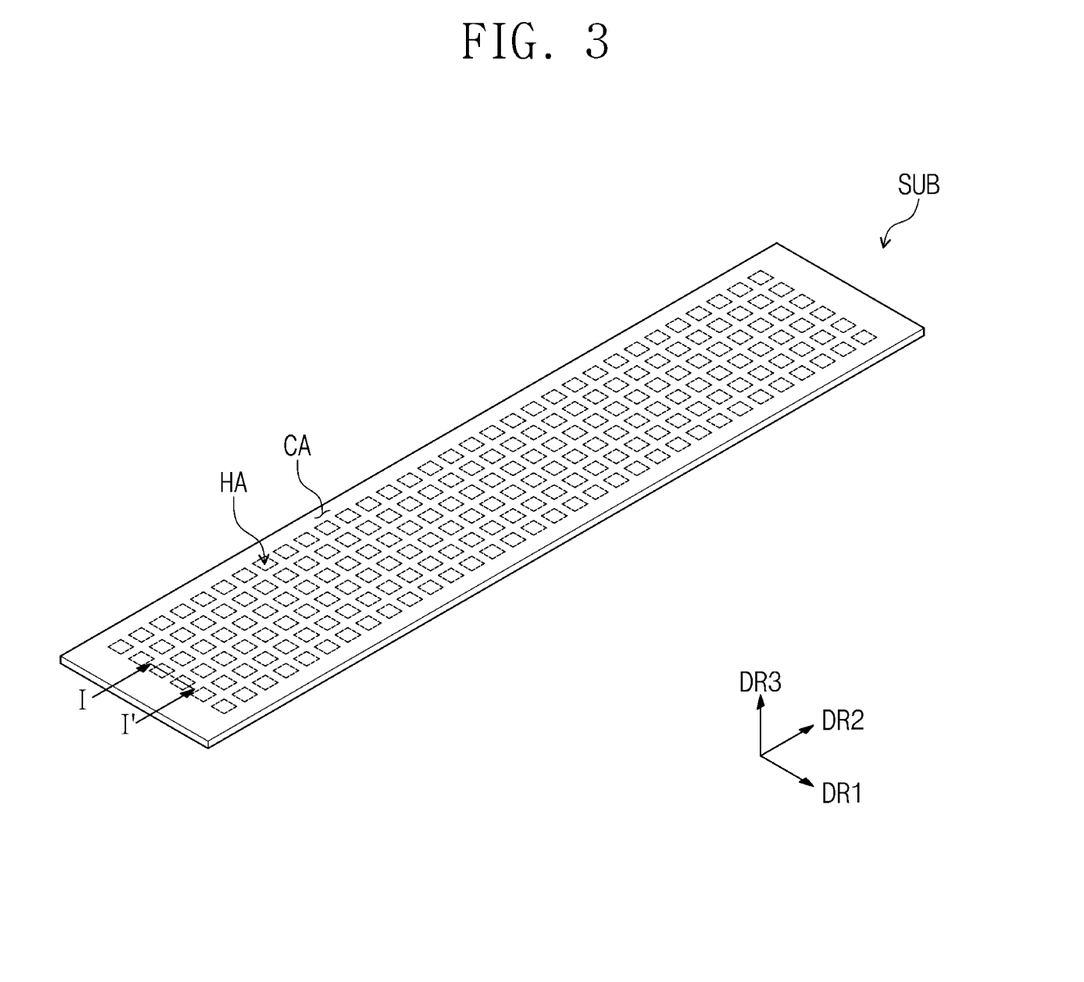
FIG. 3 is a perspective view illustrating a target substrate according to an embodiment.

FIG. 3 is a perspective view illustrating the substrate according to an embodiment. FIGS. 4 to 10 are cross-sectional views illustrating structures formed in a process of etching the substrate for forming the mask according to an embodiment. Each of FIGS. 4 to 10 shows a vertical cross-section taken along line I-I' of FIG. 3.

As shown in FIG. 3, a target substrate SUB may be prepared (in step S1). In an embodiment, the target substrate SUB may be a mother substrate for one or more of the afore-described masks (e.g., see MSK of FIG. 1) or a portion of the mother substrate. Thus, an etching process on the target substrate SUB may produce one or more of the masks MSK or a mother mask substrate.

The target substrate SUB may be formed of or include a metallic material. In an embodiment, the target substrate SUB may be formed of or include Fe—Ni alloy. Suitable material(s) of the target substrate SUB may be selected for producing the deposition mask(s) MSK.

The target substrate SUB may include a plurality of hole regions HA (or portions to be exposed and substantially removed) and a blocking region CA (or a portion to be covered and substantially retained). The hole regions HA may be spaced apart from each other and may be arranged in a matrix/array in a plan view. The hole regions HA may be regions in which mask holes MH of FIG. 1 will be formed. The blocking region CA may enclose/surround the hole regions HA in a plan view. The blocking region CA may surround the mask holes MH of FIG. 1 after the etching process.

Figure 4:
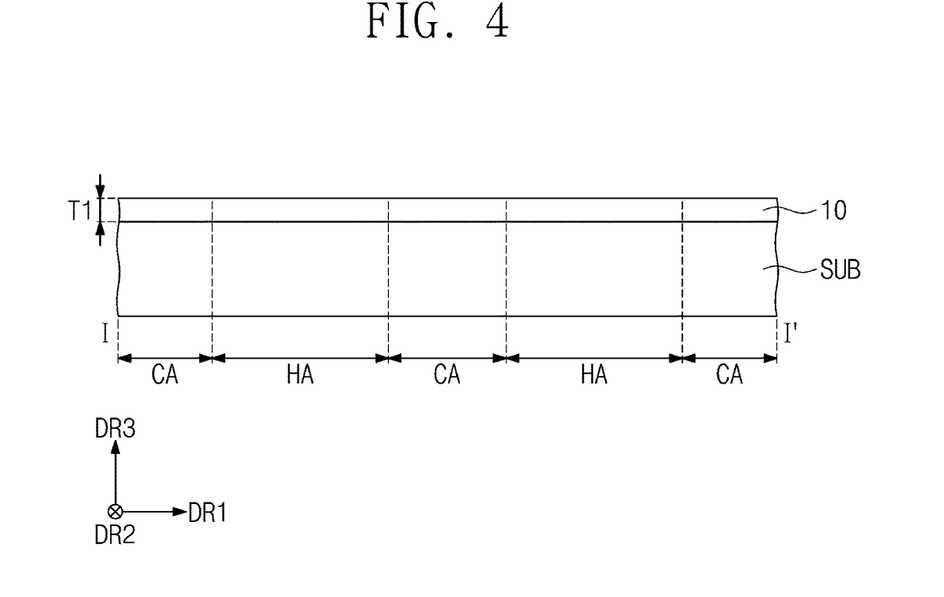
FIG. 4, FIG. 5, FIG. 6, FIG. 7, FIG. 8, FIG. 9, and FIG. 10 are cross-sectional views illustrating structures formed in a process of etching a substrate according to an embodiment.

Thereafter, as shown in FIG. 4, a first coating layer 10 (or first coating 10) may be formed on the target substrate SUB (in step S2). The first coating layer 10 may be optically transparent.

The first coating layer 10 may be formed of or include an organic material allowing for an easy subsequent patterning process. In an embodiment, the first coating layer 10 may include a negative photoresist. In an embodiment, the first coating layer 10 may include an inorganic material.

The first coating layer 10 may include a negative photoresist coated on the target substrate SUB by a spin coating process or a silk screen process.

The first coating layer 10 may be/include a film attached to the target substrate SUB by an adhesive material.

Figure 5:
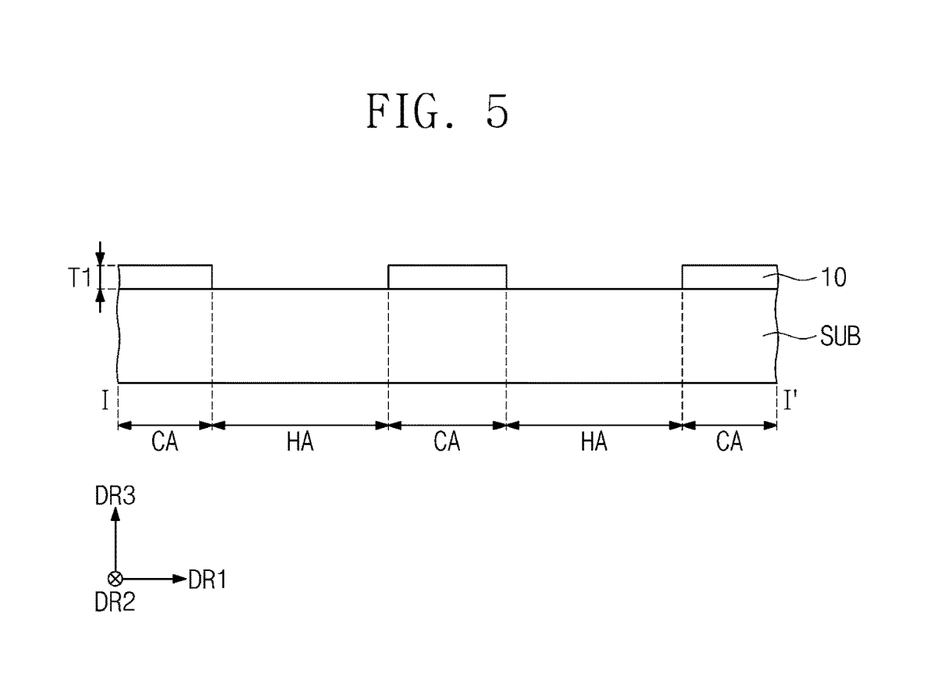

Thereafter, as shown in FIG. 5, the first coating layer 10 may be patterned (in step S3). The first coating layer 10 may include a negative photoresist and may be patterned by a photolithography process.

After the patterning step (in S3) the remaining first coating layer 10 may overlap the blocking region CA without overlapping the hole regions HA. Thus, a top surface of the target substrate SUB corresponding to the hole regions may be exposed through the first coating layer 10, as shown in FIG. 5.

When the first coating layer 10 is provided in the form of a film, the patterning step (in step S3) gray be performed in advance before disposing the first coating layer 10 on the target substrate SUB. The patterned first coating layer 10 may be disposed on the target substrate SUB after the patterning step (in S3) has been performed on the first coating layer 10.

Figure 6:
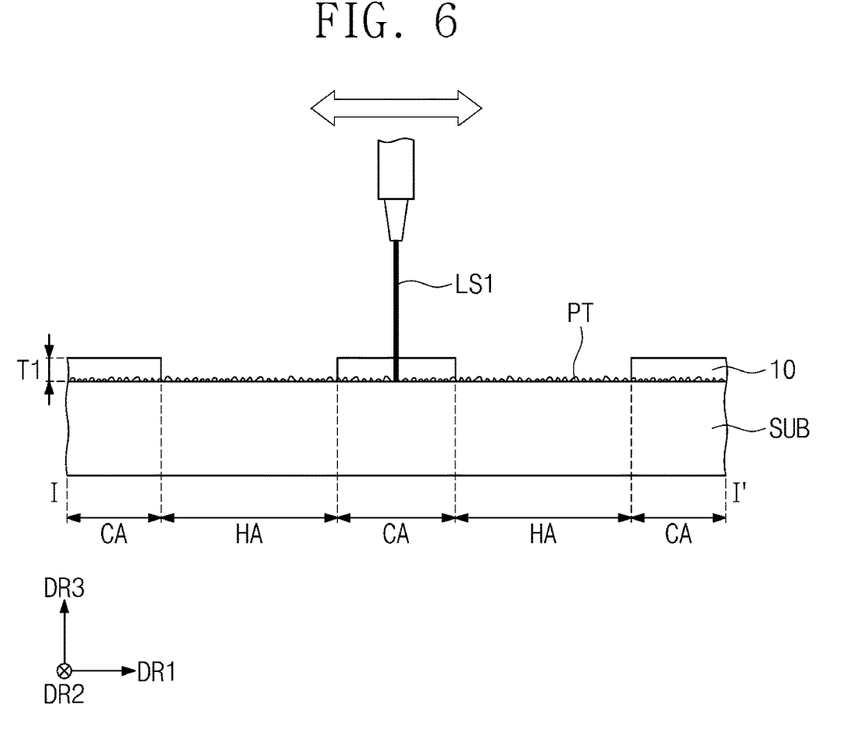

Thereafter, as shown in FIG. 6, the target substrate SUB may be irradiated with a first laser LS1. A focal point of the first laser LS1 may be positioned between the target substrate SUB and the first coating layer 10. The first laser LS1 may be generated by a laser generator and may be irradiated onto the target substrate SUB. The laser generator may be two-dimensionally movable in a plane parallel to a top surface of the target substrate SUB.

Since the first coating layer 10 is optically transparent, the first laser LS1 may pass through the first coating layer 10. According to an embodiment, a thickness T1 of the first coating layer 10 is larger than a specific value, such that the first laser LS1 may pass through the first coating layer 10 without significantly damage of the first coating layer 10.

The thickness T1 of the first coating layer 10 may be determined based on a depth of focus (DOF) of the first laser LS1. For example, the thickness T1 of the first coating layer 10 is larger than half the depth of focus (DOF), such that the first coating layer 10 may not be significantly damaged even when the first coating layer 10 is irradiated with the first laser LS1.

The depth of focus (DOF) of the first laser LS1 may be changed depending on a focal length Z. in an embodiment, the focal length Z may be given by a formula $Z=\pi w_0^2/\lambda$. where $\lambda$ is a wavelength of the first laser LS1, and $w_0$ is a diameter of the first laser LS1.

In an embodiment, the diameter $w_0$ of the first laser LS1 may be less than about 2 μm, and the thickness T1 of the first coating layer 10 may be larger than about 1.5 μm.

When the first laser LS1 is irradiated onto the target substrate SUB, particles PT may be produced on a top surface of the target substrate SUB. After the first laser LS1 has been irradiated onto the entire top surface of the target substrate SUB, particles PT may be dispersed throughout the entire top surface of the target substrate SUB.

The particles PT produced on the blocking region CA may be disposed between the target substrate SUB and the first coating layer 10. The particles PT produced on the hole regions HA may be disposed on the top surface of the target substrate SUB and may be exposed through the openings of the first coating layer 10.

In an embodiment, the first laser LS1 may be locally irradiated onto the top surface of the blocking region CA of the target substrate SUB and not onto the hole regions HA. As a result, particles PT may be produced on the top surface of a localized region (e.g., the blocking region CA) of the target substrate SUB.

Figure 7:
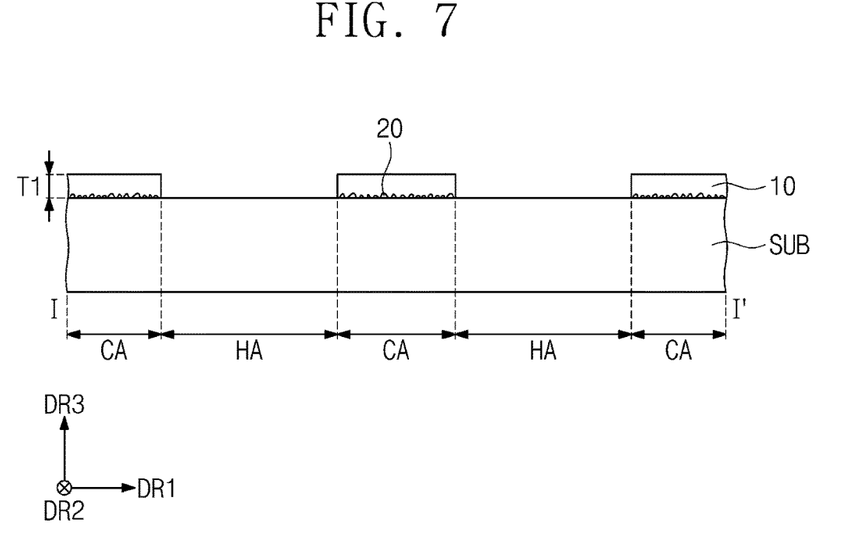

Thereafter, referring to FIG. 7, the first laser LS1 may be irradiated to remove the particles PT from the hole regions HA. The particles PT may he removed by a suction unit (not shown) or a blowing unit (not shown). The suction unit or the blowing unit may change air pressure on the top surface of the target substrate SUB and may cause movement of exposed particles PT on the hole regions HA. Thus, the exposed particles PT may be removed from the top surface of the hole regions HA of the target substrate SUB.

Particles PT produced on the blocking region CA may be disposed between the top surface of the target substrate SUB and the first coating layer 10 and may be covered with the first coating layer 10. Thus, during the process of removing particles PT, exposed particles PT may be removed from only the hole regions HA, and covered particles PT under the first coating layer 10 may not be removed from the blocking region CA. The particles PT remaining on the blocking region CA may form a scattering layer 20, or light-scattering layer 20 (in step S4 of FIG. 2).

Figure 8:
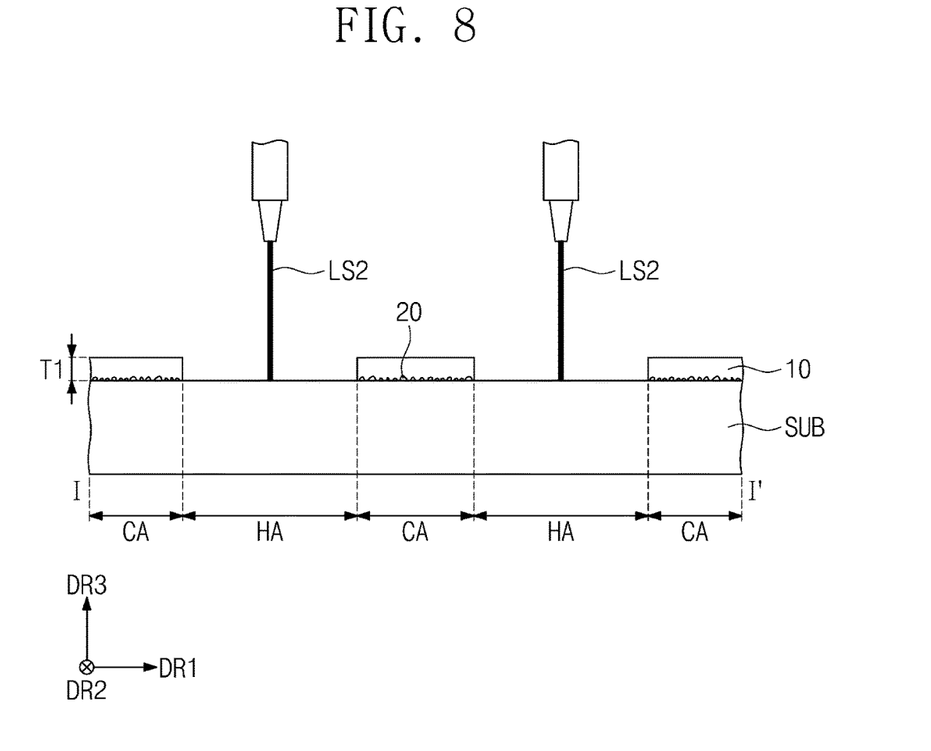

Thereafter, as shown in FIG. 8, a second laser LS2 may be irradiated onto the target substrate SUB to etch the target substrate SUB (in step S5 of FIG. 2). The hole regions HA of the target substrate SUB may he etched by the second laser LS2.

When the second laser LS2 is irradiated onto the blocking region CA of the target substrate SUB, the second laser LS2 may be scattered or irregularly reflected by the scattering layer 20. Thus, even if the second laser LS2 is irradiated onto the blocking region CA, energy of the second laser LS2 may not be significantly transferred to the target substrate SUB. Thus, the blocking region CA may not be significantly etched by the second laser LS2.

A focal length of the second laser LS2 may be longer than the focal length of the first laser LS1. Thus, a diameter of the second laser LS2 may be larger than the diameter $w_0$ of the first laser LS1. In an embodiment, the diameter of the second laser LS2 may be larger than about 10 μm. The second laser LS2 may have the same wavelength range as that of the first laser LS1.

Figure 9:
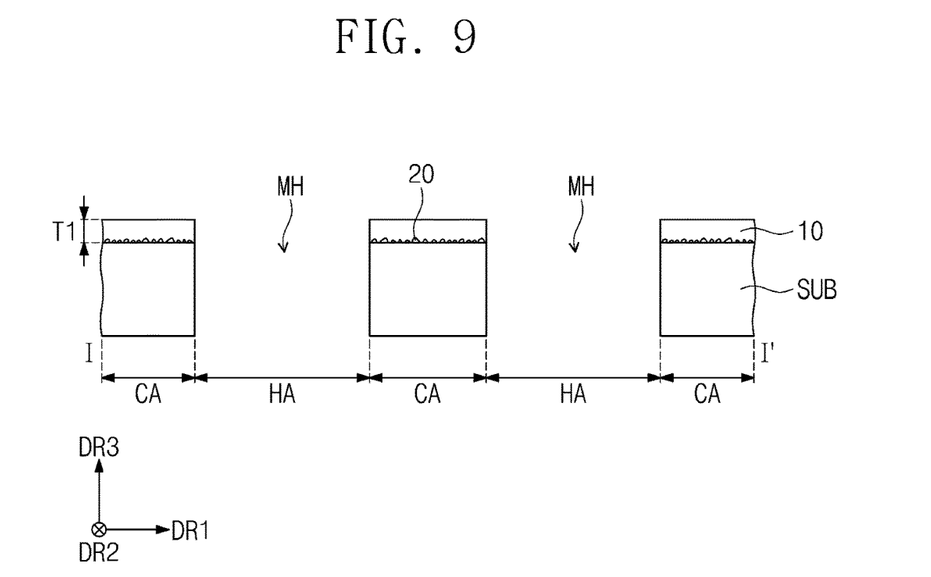

As shown in FIG. 9, as a result of the etching of the hole regions HA, the mask holes MH may be formed in the target substrate SUB. The mask holes MH may correspond to the hole regions HA in a one-to-one correspondence manner. The mask holes MH may penetrate the target substrate SUB.

Figure 10:
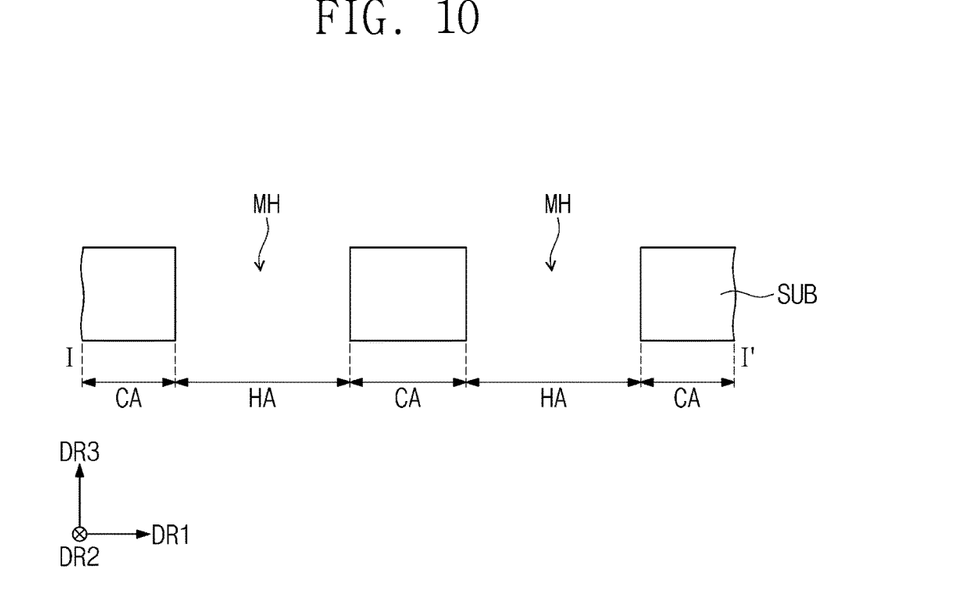

Thereafter, as shown in FIG. 10, the first coating layer 10 and the scattering layer 20 may be removed. In an embodiment, the first coating layer 10 and the scattering layer 20 may be removed by a develop process or a chemical etching process. In an embodiment, the first coating layer 10 may be firstly removed, and then the scattering layer 20 may be removed by further performing a suction process or a blowing process.

The remaining target substrate SUB, from which the first coating layer 10 and the scattering layer 20 are removed, may be used as a mask MSK described with reference to FIG. 3.

If the first coating layer 10 and the scattering layer 20 are not implemented, a misalignment between the second laser LS2 and the target substrate SUB during movement of the second laser LS2 relative to the target substrate SUB may lead to a significant variation in positions of the mask holes MH in the mask MSK. In particular, if the number of the mask holes MH per a unit area of the target substrate SUB is increased, the misalignment issue may become unacceptably severe. In contrast, according to an embodiment, the first laser LS1 passing through the first coating layer 10 may be used to form the scattering layer 20 on the blocking region CA, and the scattering layer 20 may cause an irregular reflection on the blocking region CA, which prevents the blocking region CA from being etched by the second laser LS2. Thus, it may be possible to ensure the accuracy in positions of the mask holes MH in the target substrate SUB. According to an embodiment, even when the number of the mask holes MH per the unit area of the target substrate SUB is large, it may he possible to effectively prevent the misalignment issue, because a photo lithography process allowing for a high resolution patterning may be used to pattern the first coating layer 10.

Figure 11:
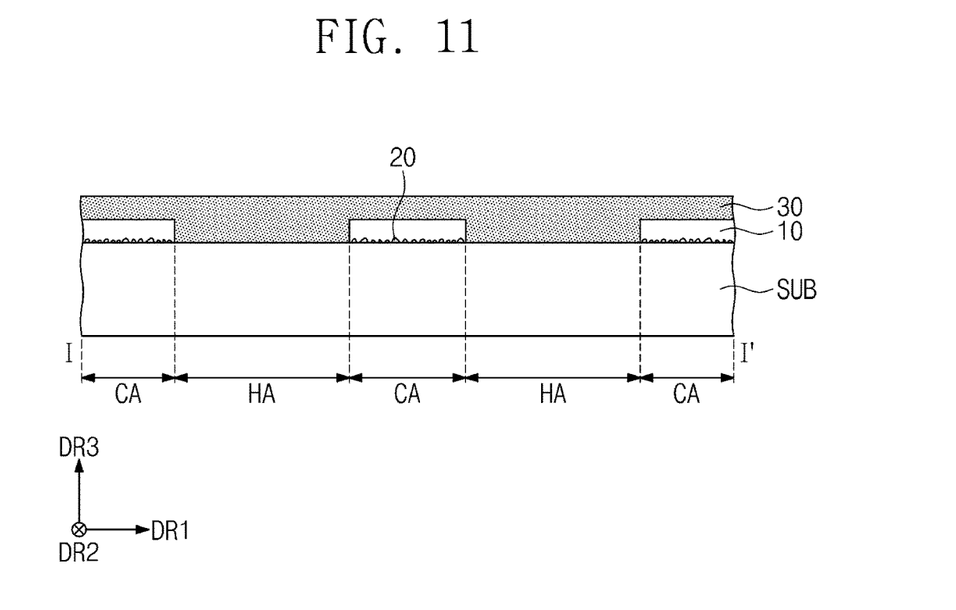
FIG. 11, FIG. 12, and FIG. 13 are cross-sectional views illustrating a process of etching a substrate according to an embodiment.
Figure 12:
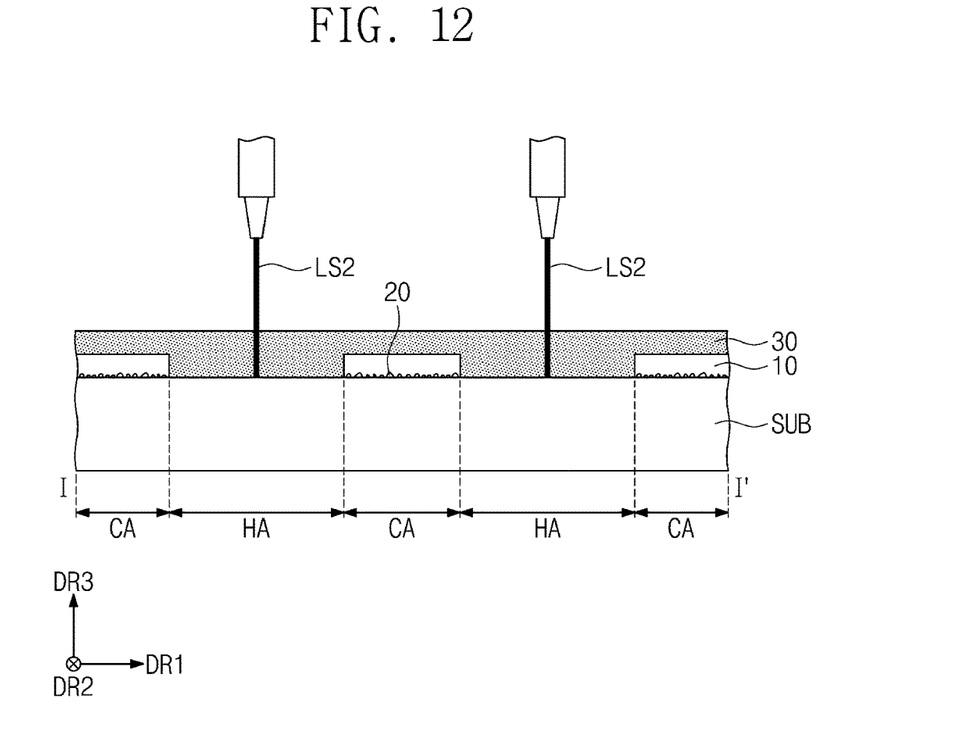
Figure 13:
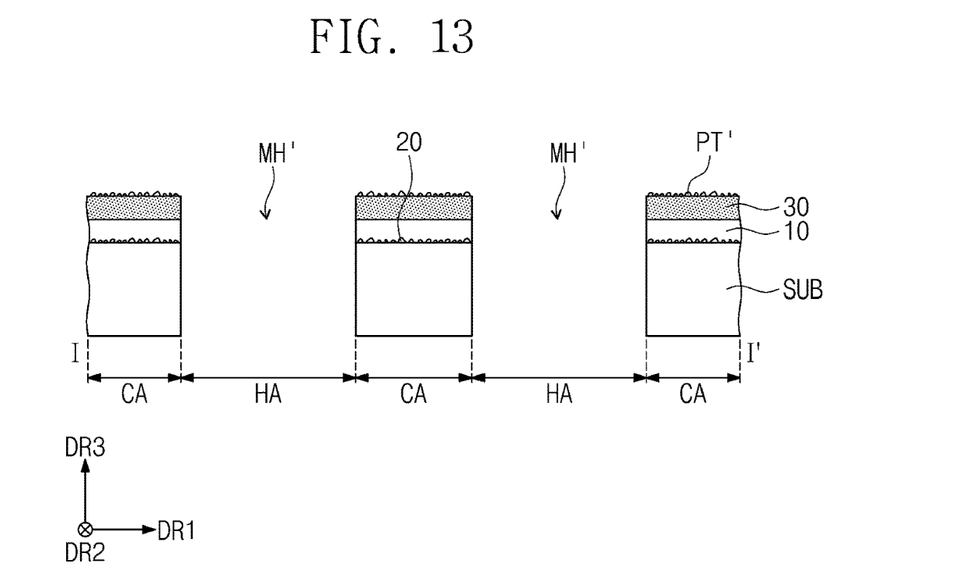

FIGS. 11 to 13 are cross-sectional views illustrating structures formed in a process of etching a substrate according to an embodiment.

For concise description, a previously described element, feature, or step may be identified by a similar or identical reference number, and associated descriptions may not be repeated.

FIGS. 11 to 13 illustrate structures that may be performed after the process of forming the scattering layer 20 (in step S4 of FIG. 2) described with reference to FIG. 7.

Referring to FIG. 11, after the formation of the scattering layer 20, a second coating layer 30 (or second coating 30) may be formed on the first coating 10 and the target substrate SUB. The second coating layer 30 may cover a top surface of the first coating layer 10 on the blocking region CA and the exposed top surface portions of the target substrate SUB on the hole regions HA.

The second coating layer 30 may have an optical transparency that is lower than the first coating layer 10. For example, the second coating layer 30 may be opaque.

The second coating layer 30 may be formed of or include an organic material. In an embodiment, the second coating layer 30 may include a positive photoresist.

An etch rate of the second coating layer 30 corresponding to the second laser LS2 may be higher than an etch rate of the target substrate SUB corresponding to the second laser LS2. In an embodiment, an etch rate of the second coating layer 30 corresponding to the second laser LS2 may be higher than about 20 times an etch rate of the target substrate SUB corresponding to the second laser LS2.

Thereafter, as shown in FIG. 12, the second laser LS2 may be irradiated onto the target substrate SUB to etch the target substrate SUB. The second laser LS2 may etch the target substrate SUB and the second coating layer 30 at the hole regions HA.

As portions of the target substrate SUB according to the second coating layer 30 at the hole regions HA are etched and removed, mask holes MH' may be formed in the target substrate SUB and the second coating layer 30, as shown in FIG. 13. The mask holes MH' may penetrate the target substrate SUB and the second coating layer 30.

Thereafter, the remaining first coating layer 10, the remaining scattering layer 20, and the remaining second coating layer 30 (remaining on the target substrate SUB) may be removed. As a result, the remaining target substrate SUB may be substantially the same as that of FIG. 10.

Generally, when the target substrate SUB containing a metallic material is etched by the second laser LS2, metallic particles may be produced. If the first coating layer 10 or the second coating 30 is not provided, a significant amount of the particles may be deposited directly on the top surface of the target substrate SUB. If the particles are larger than a specific size, the particles may not be sufficiently removed by a particle removing process (not shown), and this incomplete removal of the particles may affect a subsequent process. According to an embodiment, even when the target substrate SUB is etched by the second laser LS2, particles PT may be produced on a top surface of the second coating layer 30, not directly on the top surface of the target substrate SUB, as shown in FIG. 13. Thus, it may be possible to sufficiently remove the unwanted particles PT'.

According to an embodiment, because of improved mask accuracy, it may be possible to increase the yield of organic light emitting element manufacturing and/or display device manufacturing.

While example embodiments have been described, variations in form and detail may be made without departing from the scope of the attached claims.

What is claimed is:

1. A method for manufacturing a mask, the method comprising:
   preparing a substrate;
   providing a first coating, which is optically transparent, covers a covered portion of the substrate, and exposes exposed portions of the substrate;
   irradiating a first laser through both a material of the first coating and at least one opening of the first coating onto both the covered portion of the substrate and the exposed portions of the substrate for forming a scattering layer between the first coating and the covered portion of the substrate, wherein the scattering layer exposes the exposed portions of the substrate between portions of the scattering layer that are covered by the first coating and overlap the covered portion of the substrate; and
   removing the exposed portions of the substrate to form mask holes.

2. The method of claim 1, further comprising:
   preparing a material layer; and
   patterning the material layer to form the first coating.

3. The method of claim 1, wherein the forming of the scattering layer comprises:
   producing particles on the substrate by irradiating the substrate with the first laser, wherein a material of the particles is identical to a material of the substrate, wherein the particles include a first particle set and a second particle set, wherein the first particle set is positioned on the covered portion of the substrate, and wherein the second particle set is positioned on the exposed portions of the substrate and is exposed by the first coating; and
   removing the second particle set,
   wherein the first particle set is covered by the first coating, and wherein the scattering layer comprises the first particle set.

4. The method of claim 3, wherein the first particle set remains between the first coating and the covered portion of the substrate after the second particle set has been removed.

5. The method of claim 3, wherein the producing of the particles on the substrate comprises: positioning a focal point of the first laser between the first coating and the substrate.

6. The method of claim 3, wherein the first laser has a diameter of 2 μm or smaller.

7. The method of claim 3, wherein the first coating has a thickness of 1.5 μm or thicker.

8. The method of claim 3, wherein the removing of the exposed portions of the substrate comprises: irradiating the substrate with a second laser.

9. The method of claim 8, wherein a maximum diameter of the second laser is larger than a maximum diameter of the first laser.

10. The method of claim 8, wherein the maximum diameter of the second laser is larger than or equal to 10 μm.

11. The method of claim 8, wherein a focal length of the first laser is shorter than a focal length of the second laser.

12. The method of claim 11, wherein the first laser and the second laser have a same wavelength band.

13. The method of claim 1, further comprising: removing the first coating and the scattering layer after the removing of the exposed portions of the substrate.

14. The method of claim 1, wherein the first coating comprises a negative photoresist.

15. The method of claim 1, wherein the first coating includes openings before the first coating is disposed on the substrate, and wherein the openings expose the exposed portions of the substrate.

16. The method of claim 1, wherein the substrate comprises a metallic material.

17. The method of claim 1, further comprising: forming a second coating on the scattering layer and the substrate after the forming of the scattering layer,
   wherein an optical transparency of the second coating is lower than an optical transparency of the first coating.

18. The method of claim 17, further comprising: removing the first coating, the scattering layer, and the second coating after the removing of the exposed portions of the substrate.

19. The method of claim 17, wherein the second coating comprises a positive photoresist.

20. A method for manufacturing a mask, the method comprising:

preparing a substrate;

providing a first coating on the substrate, the first coating being optically transparent, covering a covered portion of the substrate, and exposing exposed portions of the substrate;

irradiating a first laser through both a material of the first coating and at least one opening of the first coating onto both the covered portion of the substrate and the exposed portions of the substrate to form a scattering layer between the first coating and the substrate, wherein the scattering layer exposes the exposed portions of the substrate between portions of the scattering layer that are covered by the first coating and overlap the covered portion of the substrate; and irradiating a second laser to etch the exposed portions of the substrate, wherein a maximum diameter of the second laser is larger than a maximum diameter of the first laser.

* * * * *